United States Patent
Kroeckel et al.

(10) Patent No.: US 9,713,277 B2
(45) Date of Patent: Jul. 18, 2017

(54) ELECTRONIC ARRANGEMENT COMPRISING A CIRCUIT BOARD

(71) Applicant: Robert Bosch GmbH, Stuttgart (DE)

(72) Inventors: Markus Kroeckel, Schwieberdingen (DE); Richard Gueckel, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/651,159

(22) PCT Filed: Oct. 11, 2013

(86) PCT No.: PCT/EP2013/071254
§ 371 (c)(1),
(2) Date: Jun. 10, 2015

(87) PCT Pub. No.: WO2014/090433
PCT Pub. Date: Jun. 19, 2014

(65) Prior Publication Data
US 2015/0313035 A1  Oct. 29, 2015

(30) Foreign Application Priority Data
Dec. 10, 2012  (DE) ........................ 10 2012 222 674

(51) Int. Cl.
H05K 7/14 (2006.01)
H05K 1/11 (2006.01)
H05K 5/00 (2006.01)

(52) U.S. Cl.
CPC ........... *H05K 7/1417* (2013.01); *H05K 1/117* (2013.01); *H05K 5/006* (2013.01); *H05K 5/0069* (2013.01);
(Continued)

(58) Field of Classification Search
CPC ...... H05K 7/1417; H05K 1/117; H05K 5/006; H05K 5/0069; H05K 2201/09063;
(Continued)

(56) References Cited

U.S. PATENT DOCUMENTS

| 5,231,561 A * | 7/1993 | Johnson | H05K 9/0037 |
| | | | 174/359 |
| 5,944,540 A * | 8/1999 | Asada | H05K 9/0039 |
| | | | 439/101 |

(Continued)

FOREIGN PATENT DOCUMENTS

| DE | 10162405 | 7/2003 |
| DE | 102010025086 | 12/2011 |

OTHER PUBLICATIONS

International Search Report for Application No. PCT/EP2013/071254 dated Feb. 17, 2014 (English Translation, 2 pages).

*Primary Examiner* — Zachary M Pape
*Assistant Examiner* — Douglas Burtner
(74) *Attorney, Agent, or Firm* — Michael Best & Friedrich LLP

(57) ABSTRACT

The invention relates to an electronic arrangement having a directly contactable circuit board (2), said electronic arrangement comprising: a circuit board (2) that includes at least one electric contact for electric contacting, a housing (3) inside which the circuit board (2) is arranged, and a plug shroud (33) that is arranged on the housing (3). The circuit board (2) includes a first circuit board half (24) that has a support (4) for supporting the circuit board (4), and a second circuit board half (25). The circuit board (2) is supported on the support (4) in such a way that the support (4) defines a swivel region, in particular a swivel axis of the circuit board (2), about which the circuit board (2) can swivel.

16 Claims, 3 Drawing Sheets

(52) U.S. Cl.
CPC .............. *H05K 2201/09063* (2013.01); *H05K 2201/09754* (2013.01)

(58) Field of Classification Search
CPC .......... H05K 2201/09754; H01R 12/00; H01R 24/00; H01R 12/72
See application file for complete search history.

(56) References Cited

U.S. PATENT DOCUMENTS

| | | | | |
|---|---|---|---|---|
| 6,102,742 | A * | 8/2000 | Daly | H01R 13/6616 338/21 |
| 6,282,099 | B1 * | 8/2001 | Wilson | G06F 1/184 361/727 |
| 6,424,536 | B1 * | 7/2002 | Filla | H05K 1/0271 361/749 |
| 6,764,316 | B1 * | 7/2004 | Yu | H05K 1/117 439/79 |
| 7,255,586 | B2 * | 8/2007 | Okada | H01R 13/20 439/346 |
| 8,052,455 | B1 * | 11/2011 | Peng | H01R 13/6395 439/353 |
| 9,136,661 | B1 * | 9/2015 | Lin | H01R 31/06 |
| 2003/0171015 | A1 * | 9/2003 | Korsunsky | H05K 1/117 439/108 |
| 2004/0266249 | A1 * | 12/2004 | Dobbs | H05K 1/144 439/376 |
| 2006/0044768 | A1 * | 3/2006 | Mizutani | H05K 5/006 361/752 |
| 2006/0189196 | A1 * | 8/2006 | Kameda | H01R 12/83 439/326 |
| 2006/0199412 | A1 * | 9/2006 | Kugimiya | G06F 1/1616 439/326 |
| 2008/0261449 | A1 * | 10/2008 | Ni | H01R 13/453 439/607.01 |
| 2009/0093136 | A1 * | 4/2009 | Hiew | G06F 1/1632 439/55 |
| 2010/0195304 | A1 * | 8/2010 | Takao | G06F 1/1616 361/804 |
| 2011/0039459 | A1 * | 2/2011 | Yancey | B82Y 10/00 439/884 |
| 2011/0067237 | A1 * | 3/2011 | Cohen | H01R 12/58 29/857 |
| 2012/0052736 | A1 * | 3/2012 | Fukushi | H01R 4/4836 439/626 |
| 2013/0057122 | A1 | 3/2013 | Huck | |
| 2013/0183862 | A1 * | 7/2013 | Ni | G06F 1/1632 439/620.22 |
| 2014/0080347 | A1 * | 3/2014 | Philipp | H01R 12/721 439/347 |
| 2015/0162684 | A1 * | 6/2015 | Amini | H01R 12/73 439/660 |
| 2015/0305169 | A1 * | 10/2015 | Wakana | H05K 7/20854 361/709 |

* cited by examiner

ELECTRONIC ARRANGEMENT COMPRISING A CIRCUIT BOARD

BACKGROUND OF THE INVENTION

The prevent invention relates to an electronic arrangement having a directly contactable circuit board, wherein a plug produces a direct electric contact on the circuit board.

It is known to produce a so-called direct plug connection between a circuit board and a plug, wherein the electric contacts of the plug are plugged directly onto contact surfaces on the circuit board. The circuit board can be part of a control device or also part of an electric assembly, for example an electric drive. However, this arrangement is encumbered with problems relating to contamination in the contact region or rather relating to dirt entering the interior of the control device. Furthermore, requirements with regard to anti-contact protection are to be fulfilled in the contact region. An electric window lever drive is known by way of example from DE 10201002511 A1, wherein a direct plug connection of this type is achieved. One problematic area of direct plug connections of this type resides in the fact that the circuit boards are frequently of different thicknesses. These comparatively large tolerances of a thickness of a circuit board cause an asymmetric arrangement of the circuit board relative to a plug collar and possibly cause force to be exerted in an asymmetric manner when making the contact. However, due to the fact that many users desire arrangements that have small dimensions, this leads to problems when making the contacts and even to the circuit board and/or the plug being damaged during the mounting process.

SUMMARY OF THE INVENTION

In contrast thereto, the electronic arrangement in accordance with the invention comprises the advantage that it is possible to achieve a reliable tolerance compensation in the case of a directly contactable circuit board. This has a particular advantage that the solution in accordance with the invention does not require increased installation space. Nevertheless, it is possible to compensate reliably for tolerances between different circuit board thicknesses. This is achieved in accordance with the invention by virtue of the fact that the circuit board that comprises one electrical contact surface for a direct contact is arranged in a housing having a plug collar and the circuit board can be supported on a first circuit board half by means of a mounting. The mounting for the purpose of supporting the circuit board is embodied in such a manner that the mounting defines a circuit board pivot region about which the circuit board can pivot. Consequently, the circuit board is arranged in a pivotable manner in the housing and can thus reliably compensate for different circuit board thicknesses. The mounting for the circuit board is preferably provided in a region of the circuit board, said region being remote from the plug collar, in order for the circuit board to be able to move sufficiently with as far as possible only one minimal pivot angle. The pivot angle is preferably in a range of +10° about a horizontal plane, particularly preferred in a range of +5°. Consequently, in accordance with the invention, the circuit board is only finally fixed in place after a plug has been inserted into the plug collar.

It is particularly preferred that the mounting comprises an upper mounting pin and a lower mounting pin, wherein the circuit board is mounted between the upper and the lower mounting pin. The use of the mounting pins renders it possible to spot mount the circuit board and the circuit board can be mounted in a simple and cost-effective manner. In accordance with the invention, the term "spot mounting" can also be understood to mean a very small area, by way of example a small circular area, of the mounting pin and said very small area renders possible a quasi spot mounting in comparison to the size of the circuit board.

It is further preferred that the circuit board comprises at least one through-going opening, wherein the upper and/or lower mounting pin is inserted into the through-going opening and is preferably guided through the through-going opening. This prevents in particular the circuit board from sliding out of place. It is particularly preferred that one of the mounting pins is embodied as a cone and the other mounting pin is embodied as a hollow cylinder, wherein the hollow cylinder is designed so as to receive the cone. In particular, the design of one of the mounting pins as a cone renders it possible in addition to center the circuit board in the through-going opening relative to the mounting.

It is particularly preferred that the mounting comprises a first and a second mounting region that are spaced apart from one another. It is preferred that the mounting comprises precisely two upper and two lower mounting pins. A straight-line connection of the two mounting regions thus defines a pivot axis for the circuit board. It is particularly preferred that this pivot axis is perpendicular to a plug-in direction of the electronic arrangement.

It is further preferred that an electronic component, in particular a sensitive electronic component, such as for example an acceleration sensor or the like, is arranged on the circuit board in a region between the first and second mounting region. The electronic component can be arranged on an upper face and/or a lower face of the circuit board.

It is further preferred that the circuit board protrudes in part into the plug collar of the housing. As a consequence, the electric contacts on the circuit board can be arranged in this region that protrudes into the plug collar in order to achieve a simple electrical contact.

It is further preferred that the electronic arrangement comprises, at a through-going opening that is in the housing and leads to the plug collar, a flexible element, preferably two flexible elements that lie opposite one another. The circuit board contacts at least one, preferably two, flexible elements. The circuit board is supported by the flexible element or the flexible elements, wherein due to the flexibility of the flexible elements the circuit board is nevertheless still able to pivot. This has in particular the advantage that, by way of example when transporting the electronic arrangement, said transportation usually occurring without a plug being inserted, the circuit board is nevertheless held in a secure manner and cannot pivot in the range of the pivot angle and consequently cannot suffer any damage.

It is further preferred that a first and a second resilient element is arranged on the plug collar, wherein a circuit board region that protrudes into the plug collar is arranged between the two resilient elements. As a result, the circuit board is centered if a plug is inserted into the plug collar and the electric contacts of the plug come into contact in direct contacts on the circuit board.

In accordance with a further preferred embodiment of the present invention, the electronic arrangement comprises moreover a transportation lock. The transportation lock is designed so as to be received in the plug collar of the electronic arrangement and to secure the circuit board in such a manner that the circuit board is prevented from pivoting. The transportation lock can be by way of example a stopper or the like, wherein the transportation lock regions that are in contact with the circuit board are embodied with the identical dimensions as a plug that is to be subsequently inserted.

The electronic arrangement is used in particular in conjunction with an airbag control device.

BRIEF DESCRIPTION OF THE DRAWINGS

Preferred exemplary embodiments of the invention are described in detail hereinunder with reference to the accompanying drawing. Like or rather like functioning parts are described with like reference numerals. In the drawing.

DETAILED DESCRIPTION

An electronic arrangement 1 in accordance with a first preferred exemplary embodiment of the invention is described in detail hereinunder with reference to the FIGS. 1 to 6.

Figure 1:
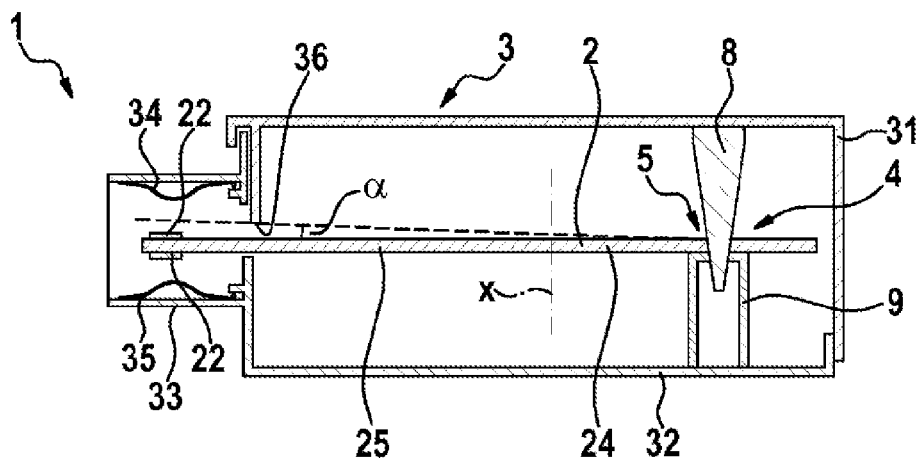
FIG. 1 illustrates a schematic sectional view of an electronic arrangement in accordance with a first exemplary embodiment of the invention.

As is evident in FIG. 1, the electronic arrangement comprises a circuit board 2 that is arranged in a housing 3. The housing 3 is embodied in two parts having a first part 31 and a second part 32. Moreover, the housing 3 comprises a plug collar 33 for the purpose of receiving a plug 12 (cf. FIGS. 4 to 6).

The electronic arrangement 1 comprises moreover a mounting 4 for the purpose of supporting the circuit board 2. As is evident in FIGS. 2 and 3, the mounting 4 comprises a first mounting region 5 and a second mounting region 6. The two mounting regions 5, 6 each form an essentially spot-like mounting for the circuit board 2 so that a straight line Y through the two mounting regions 5, 6 defines a pivot axis for the circuit board 2. As is evident in FIG. 1, the circuit board 2 is only supported in a first circuit board half 24 and not in a second circuit board half 25. The circuit board 2 is divided by means of a middle axis X into the two circuit board halves 24, 25.

Figure 3:
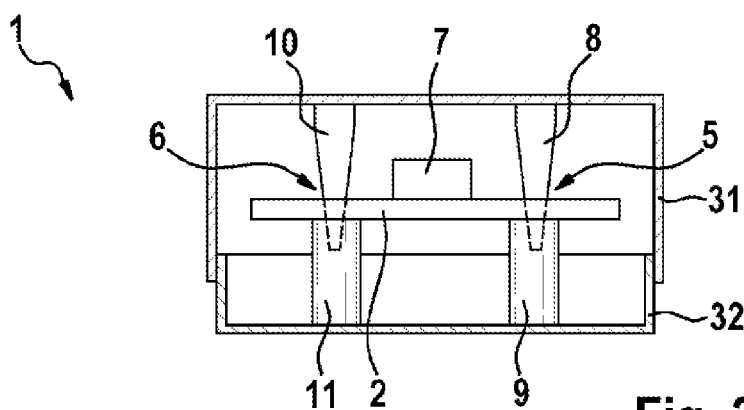
FIG. 3 illustrates a sectional view of the arrangement of FIGS. 1 and 2 from the rear.

As is particularly evident in FIGS. 1 and 3, the first mounting region 5 comprises a conical first mounting pin 8 and a hollow cylindrical second mounting pin 9. The second mounting region 6 is embodied in a like manner to the first mounting region 5 having a first conical mounting pin 10 and a second hollow cylindrical mounting pin 11. The conical mounting pins 8, 10 are guided through a first and second through-going opening 20, 21 in the circuit board 2.

Figure 2:
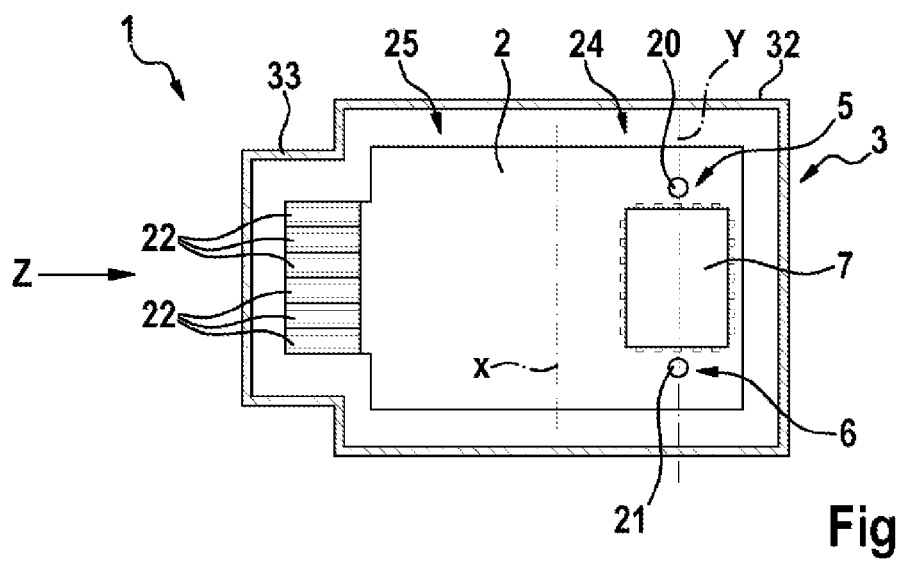
FIG. 2 illustrates a plan view of the arrangement shown in FIG. 1.

As is further evident in FIGS. 2 and 3, an electronic component, for example an acceleration sensor, is arranged between the two mounting regions 5, 6. This renders it possible to arrange very sensitive components such as the acceleration sensor in a secure manner on the circuit board 2 since the electronic component 7 lies in the pivot axis Y of the circuit board 2.

Moreover, a first resilient element 34 and a second resilient element 35 are arranged on the plug collar 33 and the plug 12 is received between said resilient elements. (cf. FIGS. 4 to 6).

The circuit board 2 moreover comprises electric contacts 22 that, as is evident in particular in FIGS. 1 and 2, are arranged in the region of the plug collar 33 of the housing 3. Consequently, the electric contacts on the circuit board protrude directly into the plug collar 33 for the purpose of producing a direct contact. The plug collar 33 is preferably arranged on the second part 32 of the housing 3.

By virtue of the fact that the circuit board 2 is mounted on one end, it is thus possible that the circuit board can pivot about the pivot axis Y through an angle α. The pivot angle is limited by a through-going opening 36 that is located in the housing 3 and leads to the plug collar 33.

Figure 4:
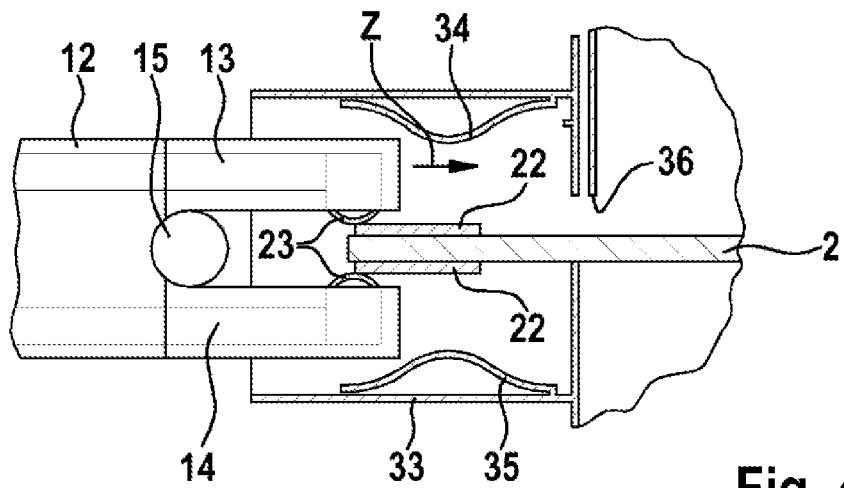
FIGS. 4 to 6 illustrate schematic detailed views of a process of inserting a plug into the electronic arrangement.
Figure 5:
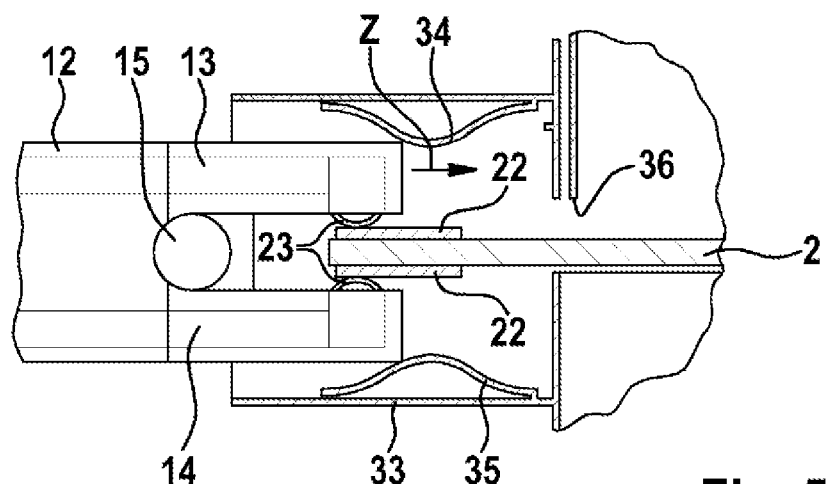
Figure 6:
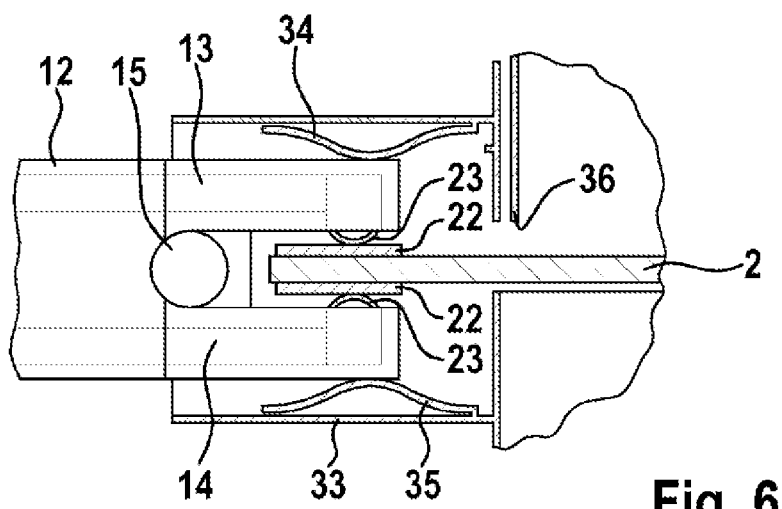

The circuit board 2 is finally fixed in place by means of inserting a plug 12, as is illustrated in FIGS. 4 to 6. The plug 12 comprises an upper contact carrier 13 and a lower contact carrier 14 and the circuit board 2 are received between the two carriers. Electric contacts 23 are arranged on the inwardly directed regions of the contact carriers 13, 14 in each case for the purpose of contacting the electric contacts 22 of the circuit board 2.

It is preferred that the two contact carriers 13, 14 are mounted in an articulated manner on an articulated joint 15 in order to render it possible to insert the two contact carriers 13, 14 individually.

The outer surfaces of the contact carrier 13, 14 come into contact with the resilient elements 34, 35 of the plug collar 33 and said resilient elements center said contact carriers.

The insertion process commences, as illustrated in FIG. 4, in such a manner that the electric contacts 23 come into contact with the circuit board or rather with the beginning of the electric contacts 22 of the circuit board. Subsequently, the plug 12 is further inserted in the direction of the arrow Z, wherein the end position between the plug 12 and the circuit board 2 has not yet been defined. As said plug is further inserted, as illustrated in FIG. 5, the contact carriers 13, 14 come into contact with the resilient elements 34, 35 so that the centering process between the plug 12 and the plug collar 33 commences. FIG. 6 illustrates the plug in the fully inserted state in the plug collar 33, wherein in addition it is possible to provide also a stop (not illustrated) on the plug collar or on another part of the housing. The unit comprising circuit board/plug 12 is centered in the plug collar by way of the resilient elements 34, 35. On the circuit board 2 itself, a resilient force of the electric contacts 23 is only exerted on the contact carriers 13, 14. By virtue of this three stage insertion process, it is achieved in particular that a contact force is generated by way of the resilient elements 34, 35 in a symmetrical manner only during the last step when the contact carriers 13, 14 come into contact with the resilient elements 34, 35 or rather when said resilient elements completely prestress the contact carriers 13, 14, as illustrated in FIG. 6.

Consequently, the invention provides a circuit board 2 that can pivot about a mounting region and is only symmetrically fixed in relation to resilient elements 34, 35 on the plug collar 33 after an electrical direct contact has been produced between the circuit board and a plug.

Figure 7:
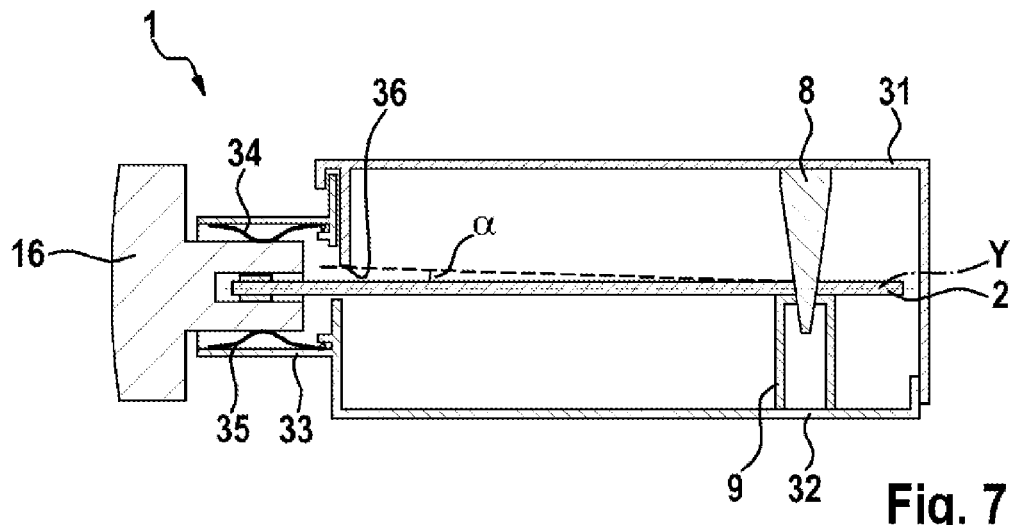
FIG. 7 illustrates an electronic arrangement in accordance with a second exemplary embodiment of the invention.

FIG. 7 illustrates an electrical arrangement 1 in accordance with a second exemplary embodiment of the invention. The electrical arrangement 1 of the second exemplary embodiment corresponds essentially to the first exemplary embodiment, wherein in addition also a transportation lock element 16 is provided. The transportation lock element 16 comprises dimensions that correspond to a plug that is to be subsequently inserted into the plug collar 33 and is inserted in the identical manner into the plug collar 33. In the inserted state, the transportation lock element 16 ensures that the circuit board 2 cannot pivot in order to avoid the circuit board becoming damaged during transportation. The transportation lock element is preferably produced from synthetic material or the like and is removed from the plug collar 33 prior to the correct plug being inserted. Consequently, contamination and penetration of dirt into the interior of the housing is avoided. It is also possible in this manner to fulfill the requirements relating to anti-contact protection.

Figure 8:
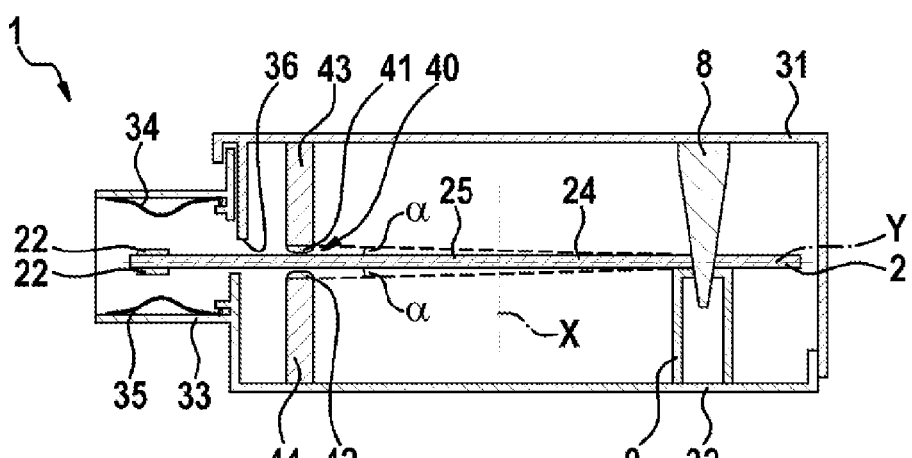
FIG. 8 illustrates a schematic view of an electronic arrangement in accordance with a third exemplary embodiment of the invention.

FIG. 8 illustrates an electronic arrangement in accordance with a third exemplary embodiment of the invention, said third exemplary embodiment corresponding essentially likewise to the first exemplary embodiment. In addition, in the case of the third exemplary embodiment also a second mounting 40 is also provided that supports the circuit board 2 on the second circuit board region 25. However, the second mounting 40 is embodied as a flexible mounting, wherein flexible elements 41, 42 are arranged on the end regions of the two retaining pins 43, 44. The retaining pins 43, 44 are arranged on the first and second part 31, 32 respectively of the housing. As is evident in FIG. 8, the circuit board 2 is in contact with the flexible elements 41, 42 that flexibly support the circuit board in particular during transportation. The flexible elements 41, 42 comprise such a degree of flexibility that it is ensured that the circuit board 2 is still able to pivot about the pivot axis Y if a plug is inserted into the plug collar 33. By virtue of providing these flexible elements 41, 42, it is possible on the one hand to limit the extent to which the circuit board can move and by way of example to damp shocks or the like and still retain a tolerance compensation of a thickness of the circuit board 2.

Figure 9:
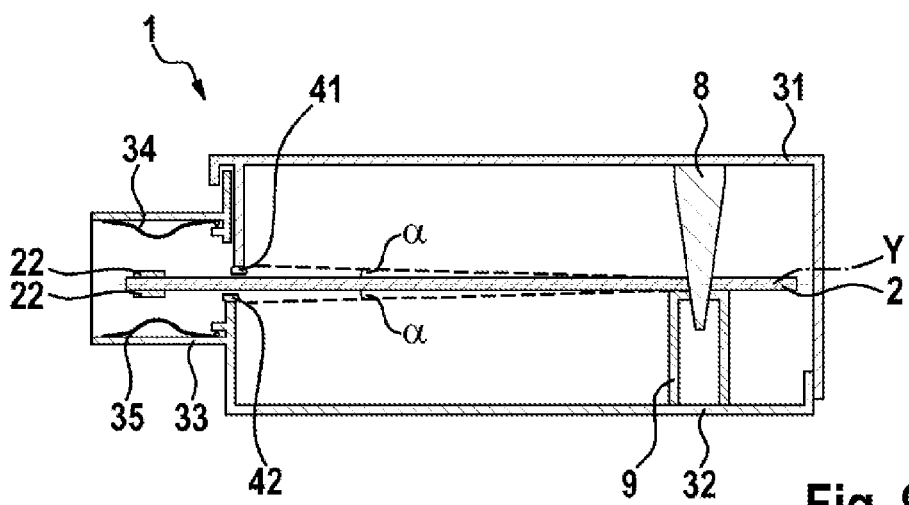
FIG. 9 illustrates a schematic view of an electronic arrangement in accordance with a fourth exemplary embodiment of the invention.

The fourth exemplary embodiment of the electric arrangement illustrated in FIG. 9 corresponds essentially to the third exemplary embodiment, wherein in the case of the forth exemplary embodiment the flexible elements 41, 42 are arranged at the through-going opening 36 that is in the housing 3 and leads to the plug collar 33. The two flexible elements 41, 42 are likewise in contact with the circuit board 2 in order to damp shocks or the like but still allow the circuit board 2 to pivot about the pivot axis Y in particular regions. By virtue of arranging the flexible elements 41, 42 at the through-going opening 36, it is not necessary to provide any additional retaining pins on the housing so that the construction of the fourth exemplary embodiment is of an even simpler design.

The invention claimed is:

1. An electronic arrangement comprising:
   a circuit board (2) having at least one electric contact (22) for making an electrical contact, and
   a housing (3) in which the circuit board (2) is arranged, and a plug collar (33) that is arranged on the housing (3),
   wherein the circuit board (2) comprises a first circuit board half (24) having a mounting (4) configured to support the circuit board (2), and a second circuit board half (25),
   wherein the circuit board (2) is supported on the mounting (4) in such a manner that the mounting (4) defines a pivot region about which the circuit board (2) is configured to pivot,
   wherein the at least one electric contact (22) of the circuit board (2) is arranged in a region of the plug collar (33) in order to produce the electrical contact,
   wherein a first resilient element (34) and a second resilient element (35) are arranged on the plug collar (33) so that the circuit board (2) is centered if a plug (12) is inserted in the plug collar (33) and at least one electric contact (23) of the plug (12) comes into contact with the at least one electric contact (22) of the circuit board (2), and
   wherein, after a direct electrical contact has been produced between the circuit board (2) and the plug (12), the circuit board (2) is symmetrically fixed in relation to the first and second resilient elements (34, 35) on the plug collar (33).

2. The arrangement as claimed in claim 1, characterized in that the mounting (4) comprises on the housing (3) a first mounting pin (8) and a second mounting pin (9) that are arranged lying opposite one another on the housing, and the circuit board (2) is mounted between the first mounting pin (8) and the second mounting pin (9).

3. The arrangement as claimed in claim 2, characterized in that the circuit board (2) comprises a through-going opening (20, 21) into which at least one of the first mounting pin and the second mounting pin (8, 9) protrudes.

4. The arrangement as claimed in claim 3, characterized in that the first mounting pin (8) is conical in shape and the second mounting pin (9) is in the form of a hollow cylinder.

5. The arrangement as claimed in claim 1, characterized in that the mounting (4) comprises a first mounting region (5) and a second mounting region (6) and each mounting region (5, 6) comprises a first mounting pin and a second mounting pin (8, 9; 10, 11).

6. The arrangement as claimed in claim 5, characterized in that a straight line through the first mounting region and the second mounting region (5, 6) is perpendicular to a plug-in direction (Z) in which a plug is inserted into the plug collar (33).

7. The arrangement as claimed in claim 5, further comprising an electronic component (7) that is arranged on the circuit board (2) between the first mounting region (5) and the second mounting region (6).

8. The arrangement as claimed in claim 1, characterized in that the circuit board (2) protrudes at least in part into the plug collar (33).

9. The arrangement as claimed in claim 1, further comprising a second mounting (40) that comprises at least one flexible element (41, 42) configured to support the circuit board (2) in a flexible manner on the second circuit board region (25).

10. The arrangement as claimed in claim 9, characterized in that the flexible element (41, 42) is arranged at the through-going opening (36) of the housing (3) towards the plug collar (33).

11. The arrangement as claimed in claim 1, further comprising a transportation lock element (16) that is configured to be received in the plug collar (33) in order to secure the circuit board (2).

12. The arrangement as claimed in claim 1, wherein said pivot region is a pivot axis of the circuit board (2).

13. The arrangement as claimed in claim 9, characterized in that the flexible element (41, 42) is arranged on a retaining pin (43, 44) that is provided on the housing (3).

14. The arrangement as claimed in claim 1, further comprising a second mounting (40) that comprises two flexible elements configured to support the circuit board (2) in a flexible manner on the second circuit board region (25).

15. The arrangement as claimed in claim 14, characterized in that the flexible elements are arranged at the through-going opening (36) of the housing (3) towards the plug collar (33).

16. The arrangement as claimed in claim 14, characterized in that the flexible elements are arranged on retaining pins (43, 44) provided on the housing (3).

* * * * *